US012635094B2

(12) United States Patent
Jeon et al.

(10) Patent No.: US 12,635,094 B2
(45) Date of Patent: May 19, 2026

(54) COVER PLATE FOR ELECTRONIC DEVICE AND ELECTRONIC DEVICE COMPRISING SAME

(71) Applicant: Samsung Electronics Co., Ltd., Suwon-si (KR)

(72) Inventors: Hwanju Jeon, Suwon-si (KR); Jungmin Yeo, Suwon-si (KR); Kyuin Lee, Suwon-si (KR); Junsang Park, Suwon-si (KR); Sunghoon Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 333 days.

(21) Appl. No.: 18/348,661

(22) Filed: Jul. 7, 2023

(65) Prior Publication Data

US 2023/0354538 A1    Nov. 2, 2023

Related U.S. Application Data

(63) Continuation of application No. PCT/KR2022/001697, filed on Feb. 3, 2022.

(30) Foreign Application Priority Data

Feb. 3, 2021    (KR) ........................ 10-2021-0015623

(51) Int. Cl.
*H05K 5/03*          (2006.01)
*B32B 5/08*          (2006.01)
(Continued)

(52) U.S. Cl.
CPC ............. *H05K 5/03* (2013.01); *H05K 9/0007* (2013.01)

(58) Field of Classification Search
CPC ....... H05K 9/003; H05K 9/007; H05K 9/0081
See application file for complete search history.

(56) References Cited

U.S. PATENT DOCUMENTS 6,399,903 B1 *  6/2002  Stevenson ............... G06F 1/182
                                          200/305
8,369,907 B2    2/2013  Lim et al.
(Continued)

FOREIGN PATENT DOCUMENTS

JP         H07290449 A       11/1995
JP         2007-529350 A     10/2007
(Continued)

OTHER PUBLICATIONS

Korean Office Action dated Jan. 7, 2025 for KR Application No. 10-2021-0015623.
(Continued)

*Primary Examiner* — Timothy J Thompson
*Assistant Examiner* — Amol H Patel
(74) *Attorney, Agent, or Firm* — Nixon & Vanderhye P.C.

(57) ABSTRACT

A cover plate for an electronic device may include: a first layer including a first surface facing a first direction, a second surface facing a second direction opposite to the first direction, and a specified type of fiber disposed between the first and second surfaces; and a second layer having a specified RF shielding effectiveness and disposed in the second direction with respect to the first layer. Various other embodiments are also possible.

17 Claims, 9 Drawing Sheets

(51) Int. Cl.

| | |
|---|---|
| *B32B 17/06* | (2006.01) |
| *B32B 27/12* | (2006.01) |
| *H04M 1/02* | (2006.01) |
| *H04M 1/18* | (2006.01) |
| *H05K 5/00* | (2025.01) |
| *H05K 9/00* | (2006.01) |

(56) References Cited

U.S. PATENT DOCUMENTS

| | | | |
|---|---|---|---|
| 9,636,893 B2 | 5/2017 | Markowski et al. | |
| 2004/0062934 A1* | 4/2004 | Miller | B32B 27/00 |
| | | | 428/413 |
| 2005/0208319 A1 | 9/2005 | Finley et al. | |
| 2008/0032093 A1 | 2/2008 | Deng et al. | |
| 2009/0208721 A1 | 8/2009 | Tsuchiya et al. | |
| 2014/0323185 A1 | 10/2014 | Lee et al. | |
| 2020/0331250 A1 | 10/2020 | Markowski et al. | |

FOREIGN PATENT DOCUMENTS

| | | | |
|---|---|---|---|
| JP | 2010179518 A | 8/2010 |
| KR | 20120010921 A | 2/2012 |
| KR | 20130122881 A | 11/2013 |
| KR | 20140077579 A | 6/2014 |
| KR | 20140141875 A | 12/2014 |
| KR | 101832303 B1 | 2/2018 |
| KR | 101851109 B1 | 4/2018 |
| KR | 101934749 B1 | 1/2019 |
| KR | 101986055 B1 | 6/2019 |
| KR | 102070279 B1 | 1/2020 |
| KR | 102087694 B1 | 3/2020 |
| KR | 102087695 B1 | 3/2020 |
| KR | 20200132528 A | 11/2020 |
| WO | WO2010/078046 A2 | 7/2018 |

OTHER PUBLICATIONS

Korean Notice of Patent Grant dated Jan. 12, 2026 for KR Application No. 10-2021-0015623.

\* cited by examiner

COVER PLATE FOR ELECTRONIC DEVICE AND ELECTRONIC DEVICE COMPRISING SAME

CROSS-REFERENCE TO RELATED APPLICATIONS

This application is a continuation of International Application No. PCT/KR2022/001697 filed on Feb. 3, 2022, designating the United States, and claiming priority to Korean Patent Application No. 10-2021-0015623 filed on Feb. 3, 2021, in the Korean Intellectual Property Office, the disclosures of all of which are hereby incorporated by reference herein in their entireties.

BACKGROUND

Field

Various example embodiments relate to a cover plate for an electronic device and/or an electronic device including the same.

Description of Related Art

Electronic devices such as smartphones are becoming necessities for modern people by providing various functions, such as message transmission and reception and photographing. In particular, the frequency of use of portable electronic devices that are easy to carry, such as smartphones, may increase due to the portability thereof. In proportion to the frequency of use of an electronic device, a situation in which the electronic device is exposed to an external impact may also occur frequently.

In the electronic device, in order to prevent damage to internal components due to an external impact, the internal components may be covered by using a cover plate. The cover plate may include a glass layer having a predetermined rigidity to protect internal components of the electronic device.

SUMMARY

The glass layer included in the cover plate may be effective in protecting the internal components of the electronic device, but it may be difficult for the glass layer to satisfy a user's satisfaction with the exterior of the electronic device. For example, the glass layer has limitations in maximizing the aesthetic effect of the cover plate exposed to the outside of the electronic device, except for its own transformation (e.g., the transformation of a surface pattern) and/or the transmission of the color of other components. Moreover, since it is sometimes desirable for the glass layer to have a thickness equal to or greater than that predetermined for rigidity of the cover plate, the weight of the electronic device is inevitably increased. A new cover plate is desirable to overcome the aesthetic limitations and/or physical disadvantages of the glass layer.

A cover plate for an electronic device and an electronic device including the same according to various example embodiments are capable of maximizing or increasing aesthetic effects of an area exposed to the outside of the electronic device and/or capable of solving physical disadvantages of the cover plate including a glass layer.

According to an example embodiment, a cover plate of an electronic device may include a first layer including a first surface facing a first direction and a second surface facing a second direction opposite to the first direction, wherein a predetermined type of fiber is disposed between the first surface and the second surface, and a second layer having a predetermined radio wave shielding rate and disposed in a second direction with respect to the first layer.

According to an example embodiment, an electronic device may include a printed circuit board, and a cover plate covering the printed circuit board. The cover plate may include a first layer including a first surface facing a first direction and a second surface facing a second direction opposite to the first direction, wherein a predetermined type of fiber is disposed between the first surface and the second surface, and a second layer having a predetermined radio wave shielding rate and disposed in a second direction with respect to the first layer.

According to various example embodiments, with a cover plate for an electronic device and an electronic device including the same, it is possible to provide aesthetic effects of various fibers by disposing a predetermined type of fiber in a layer of the cover plate.

In addition, according to various example embodiments, with a cover plate for an electronic device and an electronic device including the same, by disposing a predetermined type of fiber in a layer of the cover plate, it is possible to expect physical advantages of the disposed fiber (e.g., one or more of low weight, electrical insulation, radio wave transparency, shape flexibility, durability, and impact resistance).

In addition, according to various example embodiments, with a cover plate of an electronic device and an electronic device including the same, by using a laminated structure of a layer including fiber and another layer, it is possible to maximize or improve aesthetic effects of the layer including the fiber.

In addition, various effects identified directly or indirectly through this document may be provided.

BRIEF DESCRIPTION OF DRAWINGS

The above and other aspects, features and advantages of certain embodiments will be more apparent from the following detailed description, taken in conjunction with the accompanying drawings, in which.

In connection with the description of drawings, the same reference numerals may be assigned to the same or corresponding components.

DETAILED DESCRIPTION

Hereinafter, various example embodiments will be described with reference to the accompanying drawings. However, it is to be understood that the description is not intended to limit the disclosure to specific embodiments and includes various modifications, equivalents, and/or alternatives of the embodiments of the disclosure.

Figure 1:
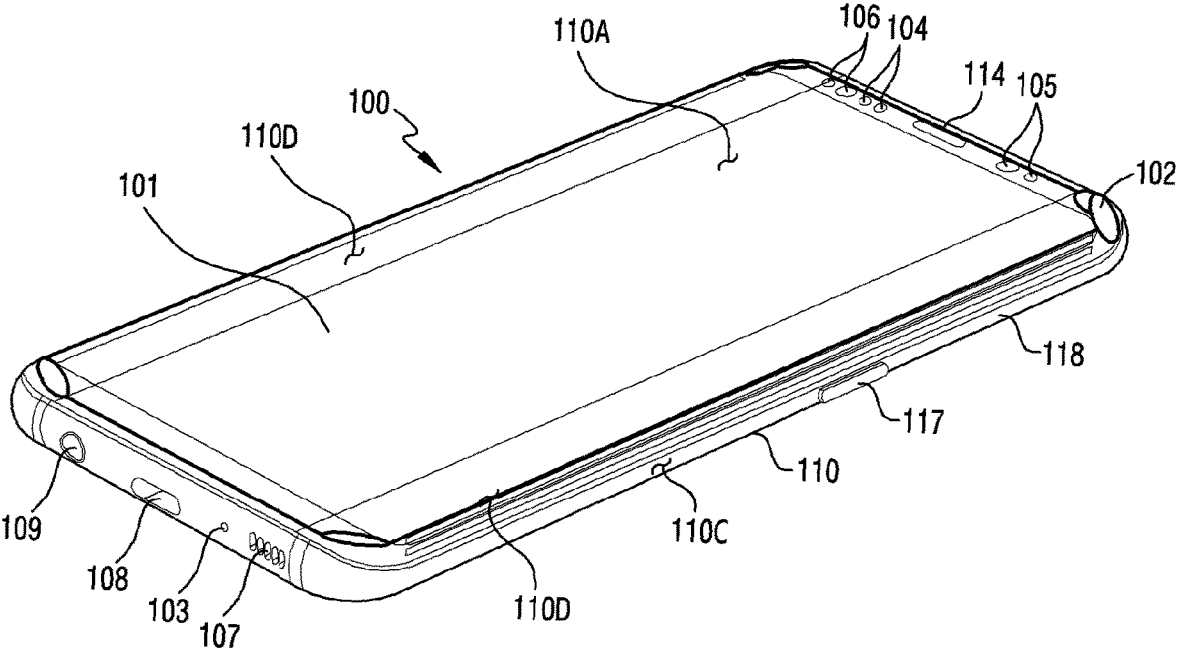
FIG. 1 is a front perspective view of an electronic device according to an example embodiment.
Figure 2:
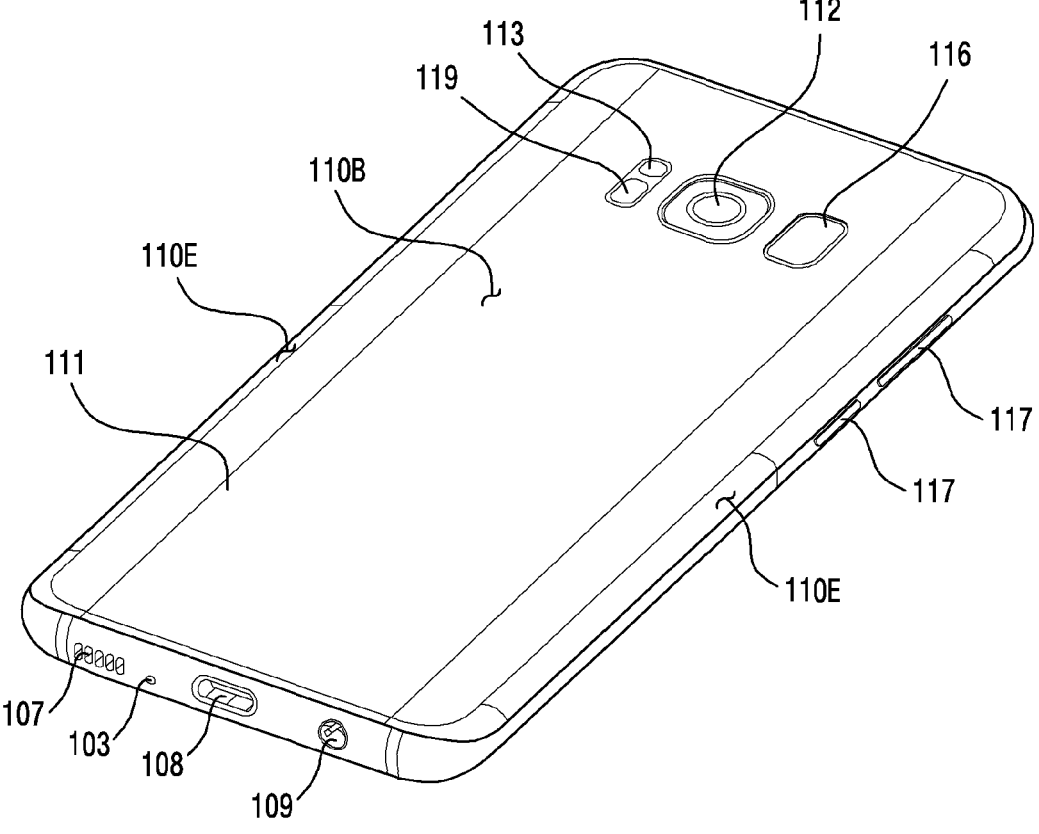
FIG. 2 is a rear perspective view of the electronic device according to an example embodiment.

FIG. 1 is a front perspective view of an electronic device according to an embodiment. FIG. 2 is a rear perspective view of the electronic device according to an embodiment.

Referring to FIGS. 1 and 2, the electronic device 100 according to an embodiment may include a housing 110 including a first face (or a front face) 110A, a second face (or a rear face) 110B, and a side face 110C surrounding the space between the first face 110A and the second face 110B. In another embodiment (not illustrated), the term "housing" may refer to a structure forming some of the first face 110A, the second face 110B, and the side face 110C of FIG. 1. According to an embodiment, at least a portion of the first face 110A may be formed of a substantially transparent front plate 102 (e.g., a glass plate or a polymer plate including various coating layers). The second face 110B may be formed by a substantially opaque rear plate 111. The rear plate 111 may be formed of, for example, coated or colored glass, ceramic, polymer, or metal (e.g., aluminum, stainless steel (STS), or magnesium), or a combination of two or more of these materials. The side face 110C may be formed by a side bezel structure 118 (or a "side member") coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include, at the long opposite side edges thereof, two first areas 110D, which are bent from the first face 110A towards the rear plate 111 and extend seamlessly. In the illustrated embodiment (see FIG. 2), the rear plate 111 may include, at the long opposite side edges thereof, two second areas 110E, which are bent from the second face 110B towards the front plate 102 and extend seamlessly. In some embodiments, the front plate 102 (or the rear plate 111) may include only one of the first areas 110D (or the second areas 110E). In another embodiment, some of the first areas 110D and the second areas 110E may not be included. In the embodiments described above, when viewed from a side of the electronic device 100, the side bezel structure 118 may have a first thickness (or width) on the side faces, which do not include the first areas 110D or the second areas 110E, and may have a second thickness (or width), which is smaller than the first thickness, on the side faces, which include the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, light-emitting elements 106, and connector holes 108 and 109. In some embodiments, at least one of the components (e.g., the key input devices 117 or the light-emitting elements 106) may be omitted from the electronic device 100, or the electronic device 100 may additionally include other components.

According to an embodiment, the display 101 may be exposed through a large portion of, for example, the front plate 102. In some embodiments, at least a portion of the display 101 may be exposed through the front plate 102 forming the first face 110A and the first areas 110D of the side faces 110C. In some embodiments, the edges of the display 101 may be formed to be substantially the same as the shape of the periphery of the front plate 102 adjacent thereto. In another embodiment (not illustrated), the distance between the periphery of the display 101 and the periphery of the front plate 102 may be substantially constant in order to enlarge the exposed area of the display 101.

In another embodiment (not illustrated), a recess or an opening may be formed in a portion of the screen display area of the display 101, and at least one of the audio module 114, the sensor module 104, the camera module 105, and the light-emitting elements 106 may be aligned with the recess or the opening. In another embodiment (not illustrated), the rear face of the screen display area of the display 101 may include at least one of the audio module 114, the sensor module 104, the camera module 105, the fingerprint sensor 116, and the light-emitting elements 106. In another embodiment (not illustrated), the display 101 may be coupled to or disposed adjacent to a touch-sensitive circuit, a pressure sensor that is capable of measuring a touch intensity (pressure), and/or a digitizer that detects a magnetic-field-type stylus pen. In some embodiments, at least some of the sensor modules 104 and 119 and/or at least some of the key input devices 117 may be disposed in the first areas 110D and/or the second areas 110E.

According to an embodiment, the audio modules 103, 107, and 114 may include a microphone hole 103 and speaker holes 107 and 114. The microphone hole 103 may include a microphone disposed therein so as to acquire external sound, and in some embodiments, multiple microphones may be disposed therein so as to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included without the speaker holes 107 and 114 (e.g., a piezo speaker).

According to an embodiment, the sensor modules 104, 116, and 119 may generate an electrical signal or a data value corresponding to the internal operating state or the external environmental state of the electronic device 100. The sensor modules 104, 116, and 119 may include, for example, a first sensor module 104 (e.g., a proximity sensor), a second sensor module (not illustrated) (e.g., a fingerprint sensor) disposed on the first face 110A of the housing 110, a third sensor module 119 (e.g., an HRM sensor), and/or a fourth sensor module 116 (e.g., a fingerprint sensor) disposed on the second face 110B of the housing 110. The fingerprint sensor may be disposed not only on the first face 110A of the housing 110 (e.g., the display 101), but also on the second face 110B. The electronic device 100 may further include at least one of sensor modules (not illustrated) such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 105, 112, and 113 may include, for example, a first camera device 105 disposed on the first face 110A of the electronic device 100 and a second camera device 112 and/or a flash 113 disposed on the second face 110B of the electronic device 100. The camera modules 105 and 112 may include one or more lenses, an image sensor, and/or an image signal processor. The flash 113 may include, for example, a light emitting diode or a xenon lamp. In some embodiments, two or more lenses (e.g., an infrared camera lens, a wide-angle lens, and a telephoto lens) and image sensors may be disposed on one face of the electronic device 100.

According to an embodiment, the key input devices 117 may be disposed on the side face 110C of the housing 110. In another embodiment, the electronic device 100 may not include some or all of the above-mentioned key input devices 117, and a key input device 117, which is not included in the electronic device 100, may be implemented in another form, such as that of a soft key or the like, on the display 101. In some embodiments, the key input devices 117 may include a sensor module 116 disposed on the second face 110B of the housing 110.

According to an embodiment, the light-emitting element 106 may be disposed on, for example, the first face 110A of the housing 110. The light-emitting element 106 may provide, for example, information about the state of the electronic device 100 in an optical form. In another embodiment, the light-emitting element 106 may provide a light source that is interlocked with, for example, the operation of the camera module 105. The light-emitting element 106 may include, for example, an LED, an IR LED, and a xenon lamp.

The connector holes 108 and 109 may include a first connector hole 108 that is capable of accommodating a connector (e.g., a USB connector) for transmitting and receiving power and/or data to and from an external electronic device, and/or a second connector hole 109 that is capable of receiving a connector (e.g., an earphone jack) for transmitting and receiving an audio signal to and from an electronic device.

Figure 3:
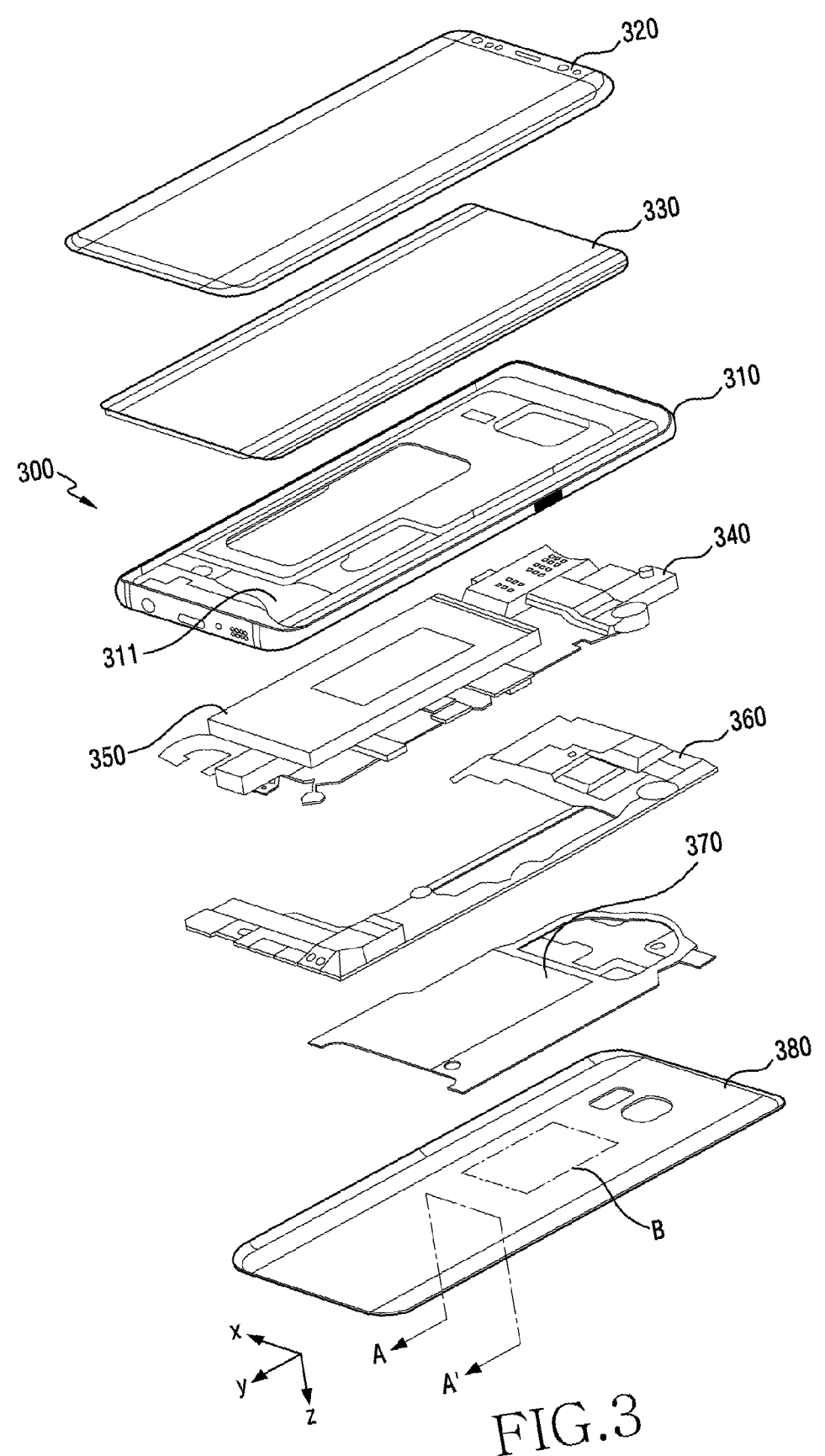
FIG. 3 is an exploded perspective view of the electronic device according to an example embodiment.

FIG. 3 is an exploded perspective view of the electronic device according to an embodiment.

Referring to FIG. 3, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or the electronic device 300 may additionally include other components. At least one of the components of the electronic device 300 may be the same as or similar to at least one of the components of the electronic device 100 of FIG. 1 or 2, and a redundant description thereof is omitted below.

According to an embodiment, the first support member 311 may be disposed inside the electronic device 300 so as to be connected, directly or indirectly, to the side bezel structure 310, or the first support member 311 may be integrally formed with the side bezel structure 310. The first support member 311 may be formed of, for example, a metal material and/or a non-metal material (e.g., a polymer). The display 330 may be coupled, directly or indirectly, to one face of the first support member 311, and the printed circuit board 340 may be coupled to the other face of the first support member 311. On the printed circuit board 340, a processor, memory, and/or an interface may be mounted. The processor may include at least one of, for example, a central processing unit (CPU), an application processor, a graphics processor, an image signal processor, a sensor hub processor, or a communication processor.

According to an embodiment, the memory may include, for example, volatile memory or nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/an MMC connector, or an audio connector.

According to an embodiment, the battery 350 is a device for supplying power to at least one component of the electronic device 300, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed within the electronic device 300, or may be detachably mounted on the electronic device 300.

According to an embodiment, the antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit and receive power required for charging to and from the external device in a wireless manner In another embodiment, an antenna structure may be formed by the side bezel structure 310, a portion of the first support member 311, or a combination thereof.

Hereinafter, a structure in which some components of an electronic device to which various embodiments related to the disclosure are applicable may be described with reference to FIGS. 1 to 3. However, FIGS. 1 to 3 merely illustrate a structure related to some components of an electronic device by way of an example and are not intended to limit the structure of the electronic device to that illustrated in FIGS. 1 to 3. For example, the electronic device may have a structure in which a housing divided into multiple areas is folded by including at least one hinge structure.

Figure 4A:
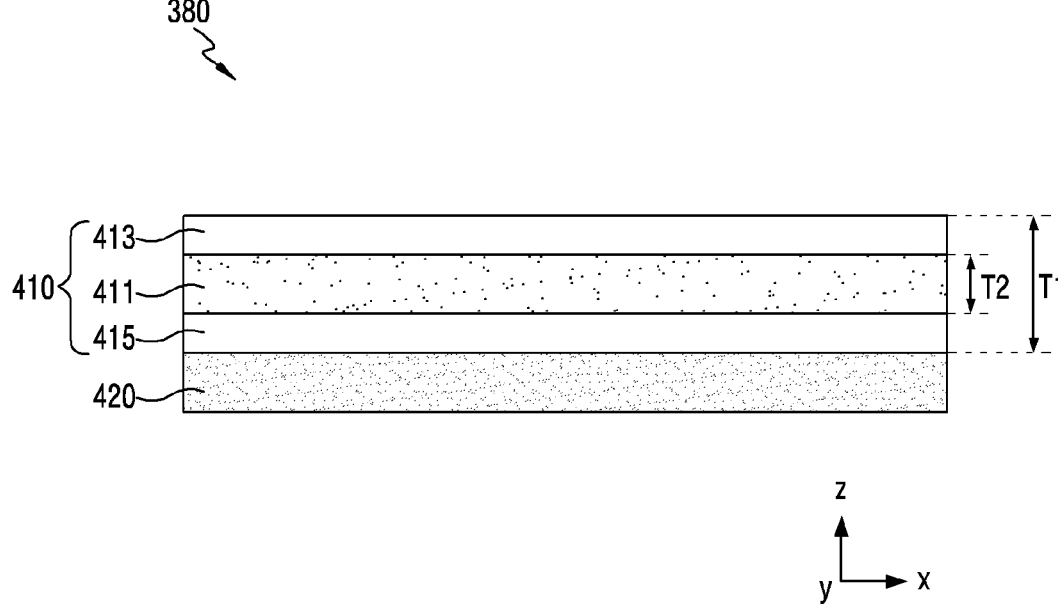
FIG. 4A is a cross-sectional view of a portion of a cover plate for an electronic device according to an example embodiment.

FIG. 4A is a cross-sectional view of a portion of a cover plate for an electronic device according to an embodiment. According to an embodiment, FIG. 4A may illustrate a cross section of a portion of the rear surface plate 380 of FIG. 3A taken along cutting plane A-A' of FIG. 3.

Referring to FIG. 4A, the cover plate 380 (or a rear surface plate) of an electronic device (e.g., the electronic device 300 of FIG. 3) may include a first layer 410 and a second layer 420 in order to enhance the aesthetics of a surface (e.g., the rear surface 110B of FIG. 2) of the electronic device 300 that may be exposed to the outside and to prevent or reduce damage to internal components (e.g., the printed circuit board 340 of FIG. 3) due to an external impact of the electronic device 300. In an embodiment, the cover plate 380 may be configured with a laminated structure of the first layer 410 and the second layer 420.

According to an embodiment, the first layer 410 may include a first surface 413 facing a first direction (e.g., the +z-axis direction) and a second surface 145 facing a second direction (e.g., the −z-axis direction). At least one of the first surface 413 and the second surface 415 may include a material having a predetermined light transmittance. For example, the first surface 413 and the second surface 415 may be a transparent epoxy (or transparent epoxy).

According to an embodiment, the first layer 410 may include a predetermined type of fiber 411. The predetermined type of fiber 411 may be disposed between the first surface 413 and the second surface 415. For example, in opposite surfaces (e.g., the surface facing the +z-axis direction and the surface facing the −z-axis direction) of the predetermined type of fiber 411, a transparent epoxy may be impregnated into the corresponding first and second surfaces 413 and 415. In an embodiment, the predetermined type of fiber 411 may have physical properties, such as low weight, high electrical insulation, radio wave transparency, shape flexibility, durability, and impact resistance, compared to a glass material.

According to an embodiment, the predetermined type of fiber 411 may be a nonwoven fabric-type fiber. The nonwoven fabric-type fiber may be, for example, at least one of glass fiber, cotton fiber, polyurethane fiber, polyester fiber, polyethylene fiber, and rayon fiber. The glass fiber may be one of yarn, roving, roving cloth, glass tape, heat-resistant cloth, woven glass fabric, chopped strand, chopped strand mat, and fabric mat. The cotton fiber may be either cotton yarn or denim The polyurethane fiber may be polyurethane synthetic fiber. The Polyester fiber may be polyester synthetic fiber. In an embodiment, the cover plate 380 may provide various aesthetic effects through the first layer 410 depending on the above-described types of fibers.

According to an embodiment, the first layer 410 may have a first thickness T1 (e.g., the thickness of 0.3 to 0.6 mm) including the first surface 413, the second surface 415, and the predetermined type of fiber 411. The first thickness T1 may be a minimum or small thickness for providing a predetermined rigidity of the cover plate 380. In an embodiment, the predetermined type of fiber 411 may have a predetermined thickness (e.g., a thickness less than or equal to 2 mm) before the first and second surfaces 413 and 415 are impregnated and may have a second thickness T2 (e.g., the thickness of 0.3 to 0.5 mm) after the first and second surfaces 413 and 415 are impregnated.

According to an embodiment, when the predetermined type of fiber 411 is disposed between the first surface 413 and the second surface 415, the first layer 410 may cause the texture of the surface of the predetermined type of fiber 411 to appear to the outside of the cover plate 380 due to the transparency of the first and second surfaces 413 and 415. For example, when the predetermined type of fiber 411 is a nonwoven fabric-type fiber, a rough texture peculiar to the nonwoven fabric-type fiber may visually appear.

According to an embodiment, the second layer 420 may have a predetermined shielding rate. For example, a shielding layer having a predetermined radio wave shielding rate may be printed on one surface (e.g., the surface facing the +z-axis direction or the surface facing the −z-axis direction) of the second layer 420. In an embodiment, the second layer 420 may be disposed in the second direction (e.g., the −z-axis direction) with respect to the first layer 410. For example, the second layer 420 and the first layer 410 may have a laminated structure. In an embodiment, a predetermined color may be printed on one surface of the second layer 420. For example, when a blue color is printed on one surface of the second layer 420, the color may be transmitted through the second surface 415, the predetermined type of fiber 411, and the first surface 413 of the first layer 410 to at least partially appear to the outside of the cover plate 380. In this case, the cover plate 380 may cause the predetermined color to appear to the outside of the cover plate 380 along with texture of the predetermined type of fiber 411 disposed in the first layer 410.

Figure 4B:
FIG. 4B is a cross-sectional view of a portion of a cover plate for an electronic device according to an example embodiment.
Figure 4B:
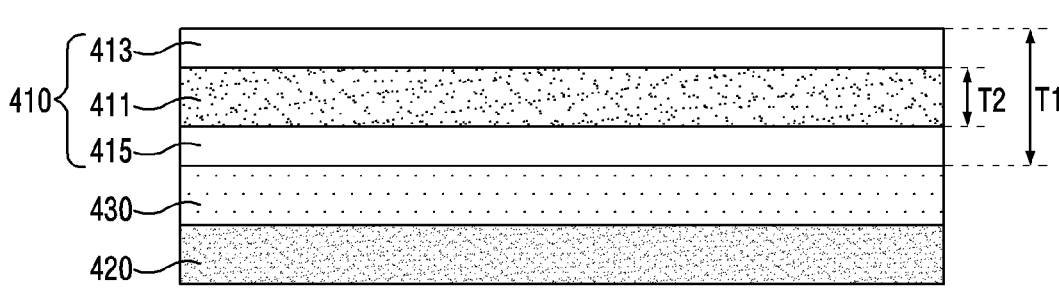
Figure 4B:
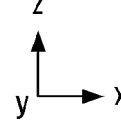

FIG. 4B is a cross-sectional view of a portion of a cover plate for an electronic device according to an embodiment.

FIG. 4B may illustrate a cross section of a portion of the rear surface plate 380 of FIG. 3A taken along cutting plane A-A' of FIG. 3. At least some of the components of FIG. 4B may correspond to the components (e.g., the first layer 410) of FIG. 4A.

Referring to FIG. 4B, the cover plate 380 of an electronic device (e.g., the electronic device 300 of FIG. 3) may include a first layer 410, a second layer 420, and a third layer 430 in order to enhance the aesthetics of a surface (e.g., the rear surface 110B of FIG. 2) of the electronic device 300 that may be exposed to the outside and to prevent or reduce damage to internal components (e.g., the printed circuit board 340 of FIG. 3) due to an external impact of the electronic device 300. In an embodiment, the cover plate 380 may be configured with a laminated structure of the first layer 410, the second layer 420, and the third layer 430.

According to an embodiment, the first layer 410 may include a first surface 413 facing a first direction (e.g., the +z-axis direction) and a second surface 145 facing a second direction (e.g., the −z-axis direction). At least one of the first surface 413 and the second surface 415 may include a material having a predetermined light transmittance. For example, the first surface 413 and the second surface 415 may be a transparent epoxy (or transparent epoxy).

According to an embodiment, the first layer 410 may include a predetermine type of fiber 411 (e.g., a nonwoven fabric-type fiber). The predetermined type of fiber 411 may be disposed between the first surface 413 and the second surface 415. For example, in opposite surfaces (e.g., the surface facing the +z-axis direction and the surface facing the −z-axis direction) of the predetermined type of fiber 411, a transparent epoxy may be impregnated into the corresponding first and second surfaces 413 and 415.

According to an embodiment, the second layer 420 may have a predetermined shielding rate. For example, a shielding layer having a predetermined radio wave shielding rate may be printed on one surface (e.g., the surface facing the +z-axis direction or the surface facing the −z-axis direction) of the second layer 420.

In an embodiment, the second layer 420 may be disposed in the second direction (e.g., the −z-axis direction) with respect to the first layer 410. For example, the second layer 420 and the first layer 410 may have a laminated structure. In an embodiment, a predetermined color may be printed on one surface of the second layer 420. For example, when a blue color is printed on one surface of the second layer 420, the color may be transmitted through the second surface 415, the predetermined type of fiber 411, and the first surface 413 of the first layer 410 to at least partially appear to the outside of the cover plate 3900. In this case, the cover plate 380 may cause a predetermined color to be expressed along with the texture of the predetermined type of fiber 411 disposed in the first layer 410.

According to an embodiment, the third layer 430 may have a predetermined reflectance. For example, the third layer 430 may be a multilayer coating having a predetermined reflectance to enhance the reflection efficiency of the first layer 410. In an embodiment, the third layer 430 may be disposed between the first layer 410 and the second layer 420. For example, the first layer 410 may be disposed on one surface (e.g., the surface facing the +z-axis direction) of the third layer 430, and the second layer 420 may be disposed on the other surface (e.g., the surface facing the −z-axis direction) of the third layer 430. In an embodiment, a color similar to (or different from) a predetermined color printed on the one surface of the second layer 420 may be printed on the one surface of the third layer 430. For example, in the case where a blue color is printed on the one surface of the third layer 430, the impression of the blue color printed on the one surface of the second layer 420 may appear to the outside of the cover plate 380 more distinctly when the blue color printed on the one surface of the second layer 420 is transmitted through the third layer 430, the second surface 415, the predetermined type of fiber 411, and the first surface 413 of the first layer 410. In this case, the cover plate 380 may maximize or improve the aesthetic effect such that the predetermined color is more clearly expressed along with the texture of the predetermined type of fiber 411 disposed in the first layer 410.

Figure 4C:
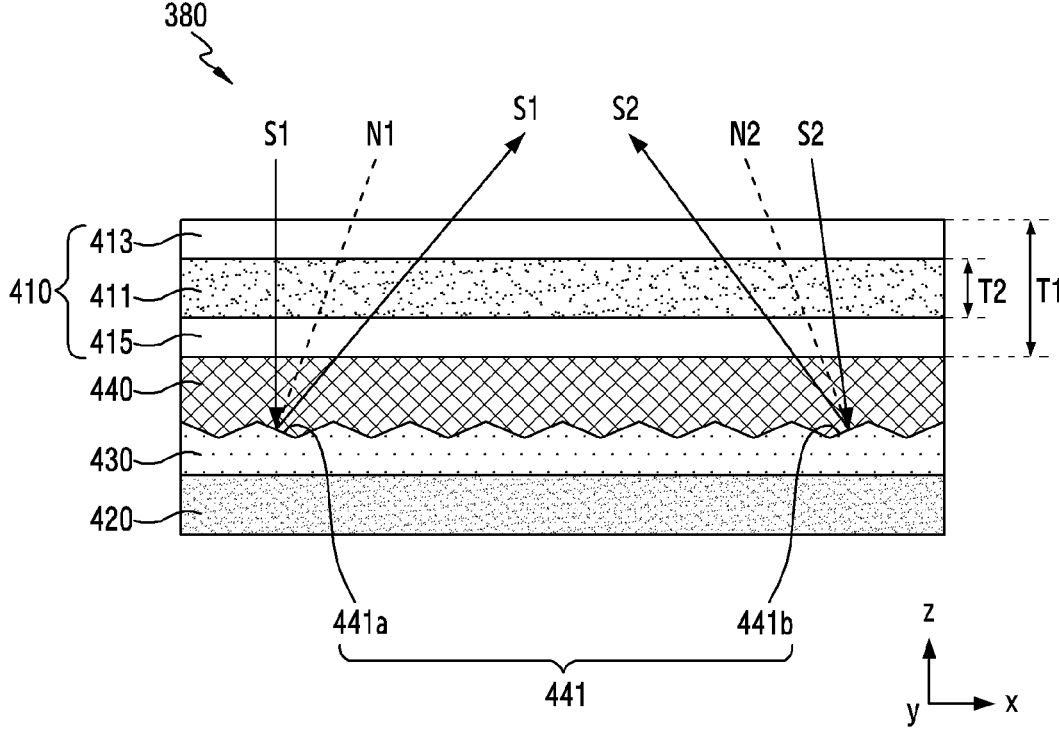
FIG. 4C is a cross-sectional view of a portion of a cover plate for an electronic device according to an example embodiment.

FIG. 4C is a cross-sectional view of a portion of a cover plate for an electronic device according to an embodiment. FIG. 4C may illustrate a cross section of a portion of the rear surface plate 380 of FIG. 3A taken along cutting plane A-A' of FIG. 3. At least some of the components of FIG. 4C may correspond to the components (e.g., the first layer 410) of FIG. 4A and/or FIG. 4B.

Referring to FIG. 4C, the cover plate 380 of an electronic device (e.g., the electronic device 300 of FIG. 3) may include a first layer 410, a second layer 420, a third layer 430, and a fourth layer 440 in order to enhance the aesthetics of a surface (e.g., the rear surface 110B of FIG. 2) of the electronic device 300 that may be exposed to the outside and to prevent or reduce damage to internal components (e.g., the printed circuit board 340 of FIG. 3) due to an external impact of the electronic device 300. In an embodiment, the cover plate 380 may be configured with a laminated structure of the first layer 410, the second layer 420, the third layer 430, and the fourth layer 440.

According to an embodiment, the first layer 410 may include a first surface 413 facing a first direction (e.g., the +z-axis direction) and a second surface 145 facing a second direction (e.g., the −z-axis direction). At least one of the first surface 413 and the second surface 415 may include a material having a predetermined light transmittance. For example, the first surface 413 and the second surface 415 may be a transparent epoxy (or transparent epoxy).

According to an embodiment, the first layer 410 may include a predetermine type of fiber 411 (e.g., a nonwoven fabric-type fiber). The predetermined type of fiber 411 may be disposed between the first surface 413 and the second surface 415. For example, in opposite surfaces (e.g., the surface facing the +z-axis direction and the surface facing the −z-axis direction) of the predetermined type of fiber 411, a transparent epoxy may be impregnated into the corresponding first and second surfaces 413 and 415.

According to an embodiment, the second layer 420 may have a predetermined shielding rate. For example, a shielding layer having a predetermined radio wave shielding rate may be printed on one surface (e.g., the surface facing the +z-axis direction or the surface facing the −z-axis direction) of the second layer 420. In an embodiment, the second layer 420 may be disposed in the second direction (e.g., the −z-axis direction) with respect to the first layer 410. For example, the second layer 420 may be formed in a laminated structure with the first layer 410.

According to an embodiment, the third layer 430 may have a predetermined reflectance. For example, the third layer 430 may be a multilayer coating having a predetermined reflectance to enhance the reflection efficiency of the first layer 410. In an embodiment, the third layer 430 may be disposed between the second layer 420 and the fourth layer 440. For example, the fourth layer 440 may be disposed on one surface (e.g., the surface facing the +z-axis direction) of the third layer 430, and the second layer 420 may be disposed on the other surface (e.g., the surface facing the −z-axis direction) of the third layer 430.

According to an embodiment, a pattern 441 including multiple portions (e.g., a first portion 441a and a second portion 441b) may be provided on the fourth layer 440. Each of the multiple portions may have a predetermined normal line or a predetermined curvature. For example, the first portion 441a (or the second portion 441b) of the multiple portions may be a reflective surface inclined by a predetermined angle with respect to a plane of a third direction (e.g., the +x-axis direction) perpendicular to a first direction (or a second direction). In an embodiment, the first portion 441a may reflect a first signal S1, which is transmitted through the first layer 410 from the first direction to the second direction, from the second direction to the first direction based on a reflection angle formed by a first normal line N1. In an embodiment, the second portion 441b may reflect a second signal S2, which is transmitted through the first layer 410 from the first direction to the second direction, from the second direction to the first direction based on a reflection angle formed by a second normal line N2. In this case, the reflection angle formed by the second normal line N2 may be formed in a different direction from the reflection angle formed by the first normal line N1, thereby causing an interference effect with the reflection angle formed by the first normal line N1. In an embodiment, based on the reflection of the above-described signals S1 and S2, the fourth layer 440 may maximize or improve an aesthetic effect such that characteristics (e.g., a texture) associated with the predetermined type of fiber 411 disposed in the first layer 410 are more prominent.

Figure 5:
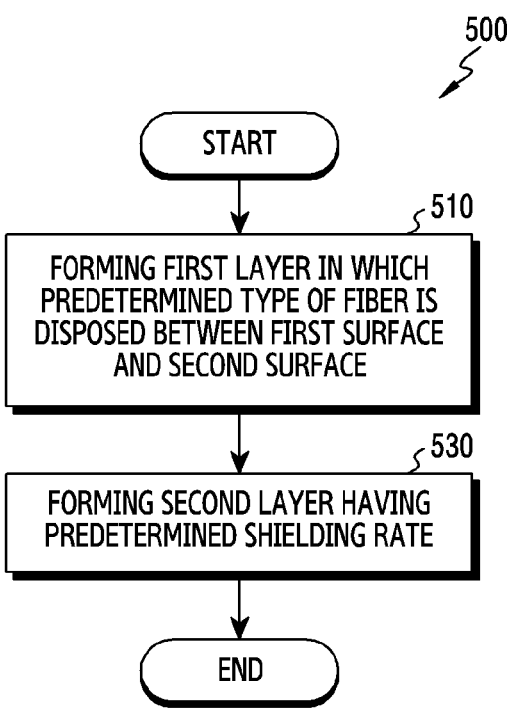
FIG. 5 is a flowchart illustrating a method for manufacturing a cover plate for an electronic device according to an example.

FIG. 5 is a flowchart illustrating a method for manufacturing a cover plate for an electronic device according to an embodiment.

Referring to FIG. 5, a cover plate (e.g., the cover plate 380 of FIG. 4A) for an electronic device (e.g., the electronic device 300 of FIG. 3) may be fabricated through a cover plate manufacturing method 500 including operations 510 and 530.

Referring to operation 510, a first layer (e.g., the first layer 410 in FIG. 4A) of the cover plate 380 may be formed such that a predetermined type of fiber (e.g., the predetermined type of fiber 411 in FIG. 4A) is disposed between a first surface (e.g., the first surface 413 in FIG. 4A) and a second surface (e.g., the second surface 415 in FIG. 4A). For example, in operation 510, the first surface 413 and the second surface 415 including a material (e.g., a transmissive epoxy) having a predetermined light transmittance may be impregnated into opposite surfaces (e.g., the surfaces facing the +z-axis direction surface and the −z-axis direction surface in FIG. 4A) of a nonwoven fabric-type fiber. In operation 510, when a material having a predetermined light transmittance is impregnated into the predetermined type of fiber 411 having a predetermined thickness (e.g., the thickness of 2 mm or less), the first layer 410 may be formed with a first thickness (e.g., the first thickness T1 in FIG. 4A), including the first surface 413, the predetermined type of fiber 411, and the second surface 413.

Referring to operation 530, in the cover plate 380, a second layer (e.g., the second layer 420 in FIG. 4A) having a predetermined shielding rate may be formed. For example, in operation 530, a shielding layer having a predetermined radio wave shielding rate may be printed on one surface (e.g., the surface facing the +z-axis direction or the surface facing the −z-axis direction) of the second layer 420. In operation 530, the second layer 420 may be disposed in the second direction (e.g., the −z-axis direction) with respect to the first layer 410. For example, the second layer 420 may be formed in a laminated structure with the first layer 410. In operation 530, a predetermined color may be printed on one surface of the second layer 420. For example, when a blue color is printed on one surface of the second layer 420, the color may be transmitted through the second surface 415, the predetermined type of fiber 411, and the first surface 413 of the first layer 410 to at least partially appear to the outside of the cover plate 380. In this case, the cover plate 380 may cause a predetermined color to be expressed along with the texture of the predetermined type of fiber 411 disposed in the first layer 410.

According to various embodiments, in the cover plate manufacturing method 500, the order of operations 510 and 530 may be changed. For example, operation 510 may be performed after operation 530.

Figure 6:
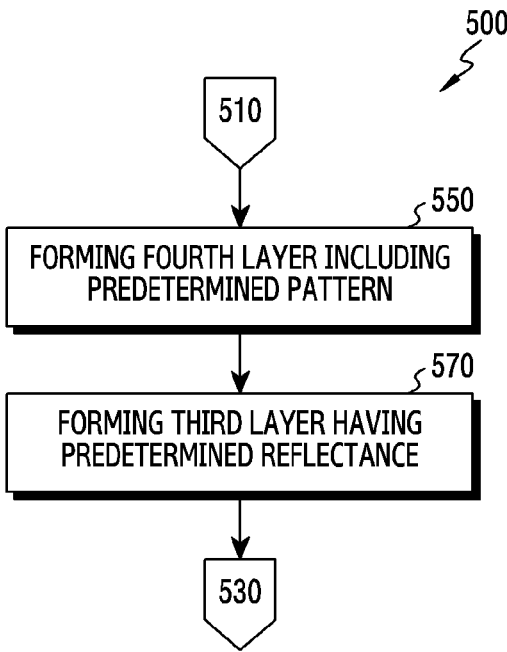
FIG. 6 is a flowchart illustrating a method for manufacturing a cover plate for an electronic device according to an example embodiment.

FIG. 6 is a flowchart illustrating a method for manufacturing a cover plate for an electronic device according to various embodiments.

Referring to FIG. 6, a cover plate (e.g., the cover plate 380 of FIG. 4C) for an electronic device (e.g., the electronic device 300 of FIG. 3) may be fabricated through a cover plate manufacturing method 500 including operations 550 and 570. In various embodiments, the cover plate manufacturing method 500 illustrated in FIG. 6 may include at least some of the operations of the cover plate manufacturing method 500 illustrated in FIG. 5. For example, the cover plate manufacturing method 500 may include operations 510 and 530 of FIG. 5.

Referring to operation 550, after operation 510 of FIG. 5, in the cover plate 380, a fourth layer (e.g., the fourth layer 440 in FIG. 4C) may be formed such that a pattern (e.g., the pattern 441 in FIG. 4C) including multiple portions (e.g., the first portion 441a and the second portion 441b in FIG. 4C) is formed. In operation 550, a predetermined normal line or a predetermined curvature may be formed in each of the multiple portions. For example, the first portion 441a (or the second portion 441b) of the multiple portions may be a reflective surface inclined by a predetermined angle with respect to a plane of a third direction (e.g., the +x-axis direction) perpendicular to a first direction (or the +z-axis direction in FIG. 4C). In operation 550, the fourth layer 440 may be disposed in the second direction (e.g., the −z-axis direction in FIG. 4C) with respect to the first layer (e.g., the first layer 410 in FIG. 4C). For example, the fourth layer 440 may be formed in a laminated structure with the first layer 410.

Referring to operation 570, in the cover plate 380, a third layer (e.g., the third layer 430 in FIG. 4A) having a predetermined reflectance may be formed. In operation 570, the third layer 430 may be a multilayer coating having a predetermined reflectance to enhance the reflection efficiency of the first layer 410. In operation 570, the third layer 430 may be disposed in a second direction with respect to the fourth layer 440. For example, the third layer 430 may be formed in a sequentially laminated structure with the first layer 410 and the fourth layer 440. After operation 570, operation 530 of FIG. 5 may be performed. For example, in operation 530, the second layer (e.g., the second layer 420 of FIG. 4C) may be disposed in the second direction with respect to the third layer 430.

Figure 7:
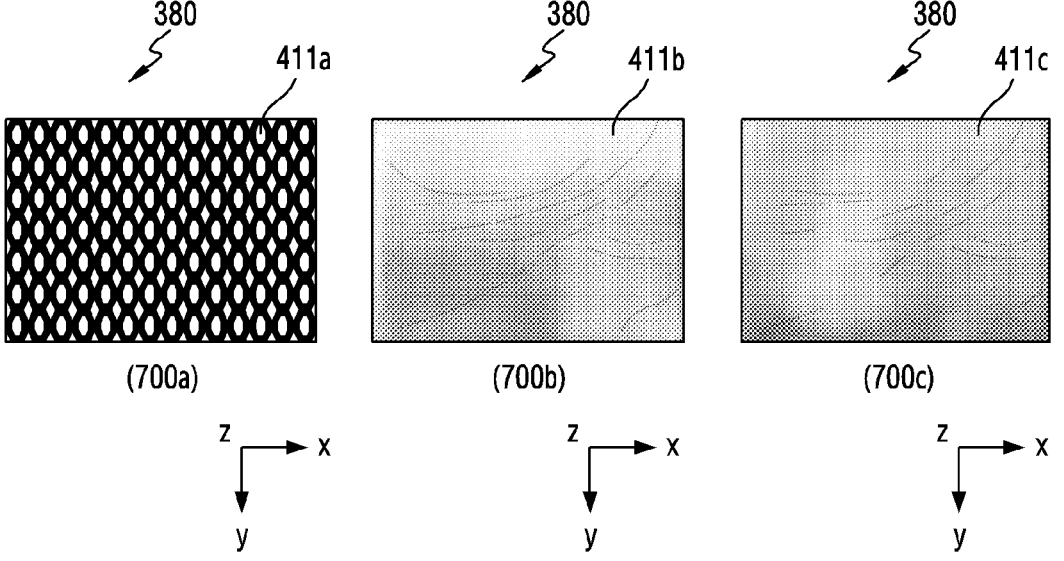
FIG. 7 is a diagram illustrating surfaces exposed to the outside through a cover plate of an electronic device according to various example embodiments.

FIG. 7 is a diagram illustrating surfaces exposed to the outside through a cover plate of an electronic device according to various embodiments. FIG. 7 may illustrate surfaces visible when viewing area "B" of the rear surface plate 380 illustrated in FIG. 3 from the first direction (e.g., the +z-axis direction of FIG. 3). At least some of the components of FIG.

7 may correspond to the components (e.g., the first layer 410 in FIG. 4A) of FIGS. 4A to 4C.

Referring to FIG. 7, the cover plate 380 of the electronic device 300 may express the same textile and color as the surface of one of a first surface 700a, a second surface 700b, and a third surface 700c depending on a predetermined type of fiber (e.g., the predetermined type of fiber 411 in FIG. 4A) disposed in the first layer (e.g., the first layer 410 in FIG. 4A) to the outside thereof.

Referring to the first surface 700a, a nonwoven fabric-type polyurethane synthetic fiber 411a may be disposed inside the first layer 410 located in the first direction of the cover plate 380. The nonwoven fabric-type polyurethane synthetic fiber 411a may have cross stripes. In various embodiments, one surface (e.g., the surface facing the +z-axis direction) of the second layer (e.g., the second layer 420 in FIG. 4A) located in the second direction (e.g., the −z-axis direction) with respect to the first layer 410 may be printed with a predetermined color. When a blue color is printed on one surface of the second layer 420, the color may be transmitted through the first layer 410 and may at least partially appear to the outside of the cover plate 380. In this case, when a user views the first surface 700a of the cover plate 380 from the first direction, the user may recognize the texture and color of the nonwoven fabric-type polyurethane synthetic fiber 411a including blue cross stripes.

Referring to the second surface 700b, a nonwoven fabric-type chopped strand fiber 411b may be disposed inside the first layer 410 located in the first direction of the cover plate 380. The nonwoven fabric-type chopped strand fiber 411a may have a structure in which rovings having a predetermined length (e.g., 3 to 5 mm) are arranged. In various embodiments, one surface (e.g., the surface facing the +z-axis direction) of the second layer 420 located in the second direction (e.g., the −z-axis direction) with respect to the first layer 410 may be printed with a predetermined color. When a red color is printed on one surface of the second layer 420, the color may be transmitted through the first layer 410 and may at least partially appear to the outside of the cover plate 380. In this case, when a user views the first surface 700a of the cover plate 380 from the first direction, the user may recognize the texture and color of the nonwoven fabric-type chopped strand fiber 411b including red color.

Referring to the third surface 700c, a nonwoven fabric-type chopped strand mat fiber 411c may be disposed inside the first layer 410 located in the first direction of the cover plate 380. The nonwoven type chopped strand mat fiber 411c may have a structure in which rovings having a predetermined length (e.g., about 5 mm) are arranged non-directionally. In various embodiments, one surface (e.g., the surface facing the +z-axis direction) of the second layer 420 located in the second direction (e.g., the −z-axis direction) with respect to the first layer 410 may be printed with a predetermined color. When a gray color is printed on one surface of the second layer 420, the color may be transmitted through the first layer 410 and may at least partially appear to the outside of the cover plate 380. In this case, when a user views the first surface 700a of the cover plate 380 from the first direction, the user may recognize the texture and color of the nonwoven fabric-type chopped strand fiber 411c including gray color.

According to various embodiments, a cover plate (e.g., the cover plate 380) for an electronic device (e.g., the electronic device 300) may include a first layer (e.g., the first layer 410) including a first surface (e.g., the first surface 413) facing a first direction and a second surface (e.g., the second surface 415) facing a second direction opposite to the first direction, wherein a predetermined type of fiber (e.g., the predetermined type of fiber 411) is disposed between the first surface and the second surface; and a second layer (e.g., the second layer 420) having a predetermined radio wave shielding rate and disposed in a second direction with respect to the first layer.

According to various embodiments, the predetermined type of fiber may be a nonwoven type.

According to various embodiments, the predetermined type of fiber may include at least one of glass fiber, cotton fiber, polyurethane fiber, polyester fiber, polyethylene fiber, and rayon fiber.

According to various embodiments, at least one of the first surface of the first layer and the second surface of the first layer may include a material having a predetermined light transmittance.

According to various embodiments, the material having the predetermined light transmittance may include a transmissive epoxy (or transparent epoxy).

According to various embodiments, the material having the predetermined light transmittance may be impregnated into the predetermined type of fiber.

According to various embodiments, the first layer may have a predetermined thickness (e.g., the first thickness T1) via the material having the predetermined light transmittance and the impregnated structure of the predetermined type of fiber.

According to various embodiments, the cover plate may include a third layer (e.g., the third layer 430) having a reflectance and disposed between the first layer and the second layer.

According to various embodiments, the cover plate may include a fourth layer (e.g., the fourth layer 440) on which a pattern (e.g., the pattern 441) including multiple portions (e.g., the first portion 441*a* and the second portion 441*b*) is provided and which is disposed between the first layer and the second layer, and each of the multiple portions may have a predetermined normal line or a predetermined curvature.

According to various embodiments, each of the multiple portions may form multiple reflection angles by the predetermined normal line or the predetermined curvature.

According to various embodiments, an electronic device may include a printed circuit board (e.g., the printed circuit board 340), and a cover plate (e.g., the cover plate 380) configured to cover the printed circuit board. The cover plate may include a first layer (e.g., the first layer 410) including a first surface (e.g., the first surface 413) facing a first direction and a second surface (e.g., the second surface 415) facing a second direction opposite to the first direction, wherein a predetermined type of fiber (e.g., the predetermined type of fiber 411) is disposed between the first surface and the second surface; and a second layer (e.g., the second layer 420) having a predetermined radio wave shielding rate and disposed in a second direction with respect to the first layer.

According to various embodiments, the predetermined type of fiber may be a nonwoven type.

According to various embodiments, the predetermined type of fiber may include at least one of glass fiber, cotton fiber, polyurethane fiber, polyester fiber, polyethylene fiber, and rayon fiber.

According to various embodiments, at least one of the first surface of the first layer and the second surface of the first layer may include a material having a predetermined light transmittance.

According to various embodiments, the material having the predetermined light transmittance may include a transmissive epoxy (or transparent epoxy).

According to various embodiments, the material having the predetermined light transmittance may be impregnated into the predetermined type of fiber.

According to various embodiments, the first layer may have a predetermined thickness (e.g., the first thickness T1) by means of the material having the predetermined light transmittance and the impregnated structure of the predetermined type of fiber.

According to various embodiments, the cover plate may include a third layer (e.g., the third layer 430) having a predetermined reflectance and disposed between the first layer and the second layer.

According to various embodiments, the cover plate may include a fourth layer (e.g., the fourth layer 440) on which a pattern (e.g., the pattern 440) including multiple portions (e.g., the first portion 441*a* and 441*b*) is provided and which is disposed between the first layer and the second layer, and each of the multiple portions may have a predetermined normal line or a predetermined curvature.

According to various embodiments, each of the multiple portions may form multiple reflection angles by the predetermined normal line or the predetermined curvature.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. A cover plate for an electronic device, the cover plate comprising:

a first layer comprising a first surface facing a first direction and a second surface facing a second direction opposite to the first direction, wherein fiber is disposed between at least the first surface and the second surface;

a second layer having a predetermined radio wave shielding rate and disposed in a second direction with respect to the first layer;

a third layer at which a predetermined color is printed and disposed between the first layer and the second layer; and a fourth layer forming a plurality of reflection angles and disposed between the first layer and the third layer.

2. The cover plate of claim 1, wherein the fiber comprises a nonwoven type fiber.

3. The cover plate of claim 1, wherein the fiber comprises at least one of glass fiber, cotton fiber, polyurethane fiber, polyester fiber, polyethylene fiber, and rayon fiber.

4. The cover plate of claim 1, wherein at least one of the first surface of the first layer and the second surface of the first layer comprises a material having a predetermined light transmittance.

5. The cover plate of claim 4, wherein the material having the predetermined light transmittance comprises a transmissive epoxy.

6. The cover plate of claim 4, wherein the material having the predetermined light transmittance is impregnated into the fiber.

7. The cover plate of claim 6, wherein the first layer has a predetermined thickness by an impregnated structure of the material having the predetermined light transmittance and the fiber.

8. The cover plate of claim 1, wherein the fourth layer includes thereon a pattern comprising multiple portions, and wherein each of the multiple portions has a predetermined normal line and/or a predetermined curvature.

9. The cover plate of claim 8, wherein each of the multiple portions forms the plurality of reflection angles by the predetermined normal line and/or the predetermined curvature.

10. An electronic device comprising:

a printed circuit board; and a cover plate covering at least the printed circuit board, wherein the cover plate comprises:

a first layer comprising a first surface facing a first direction and a second surface facing a second direction opposite to the first direction, wherein fiber is disposed between at least the first surface and the second surface;

a second layer having a predetermined radio wave shielding rate and disposed at least in a second direction with respect to the first layer;

a third layer at which a predetermined color is printed and disposed between the first layer and the second layer; and a fourth layer forming a plurality of reflection angles and disposed between the first layer and the third layer.

11. The electronic device of claim 10, wherein at least one of the first surface of the first layer and the second surface of the first layer comprises a material having a predetermined light transmittance, and wherein the material having the predetermined light transmittance is impregnated into the fiber.

12. The electronic device of claim 11, wherein the first layer has a predetermined thickness by an impregnated structure of the material having the predetermined light transmittance and the fiber.

13. The electronic device of claim 10, wherein the fourth layer includes thereon a pattern comprising multiple portions, and wherein each of the multiple portions has a predetermined normal line and/or a predetermined curvature.

14. The electronic device of claim 13, wherein each of the multiple portions forms the plurality of reflection angles by the predetermined normal line and/or the predetermined curvature.

15. The electronic device of claim 10, wherein the material having the predetermined light transmittance comprises a transmissive epoxy.

16. The electronic device of claim 10, wherein the fiber comprises a nonwoven type fiber.

17. The electronic device of claim 10, wherein the fiber comprises at least one of glass fiber, cotton fiber, polyurethane fiber, polyester fiber, polyethylene fiber, and rayon fiber.

\* \* \* \* \*